United States Patent [19]
Staring et al.

[11] Patent Number: 6,014,119
[45] Date of Patent: *Jan. 11, 2000

[54] ELECTROLUMINESCENT DISPLAY DEVICE INCLUDING ACTIVE POLYMER LAYER

[75] Inventors: Aemilianus G. J. Staring; David B. Braun; Karel E. Kuijk, all of Eindhoven, Netherlands

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/649,351

[22] Filed: May 17, 1996

[30] Foreign Application Priority Data

May 19, 1995 [EP] European Pat. Off. ............... 95201318

[51] Int. Cl.$^7$ ........................................................ G09G 3/32
[52] U.S. Cl. ................................................ 345/82; 345/77
[58] Field of Search ................................. 345/82, 83, 76, 345/77, 78, 80; 313/500, 503, 504, 505; 315/169.1, 169.3; 357/17; 437/1; 257/40; 250/214; 428/212

[56] References Cited

U.S. PATENT DOCUMENTS

| | | | |
|---|---|---|---|
| 4,839,563 | 6/1989 | Boudreau et al. | 315/169 |
| 4,866,348 | 9/1989 | Harada et al. | 315/169.3 |
| 5,142,343 | 8/1992 | Hosokawa et al. | 357/17 |
| 5,247,190 | 9/1993 | Friend et al. | 257/40 |
| 5,334,539 | 8/1994 | Shinar et al. | 437/1 |
| 5,352,906 | 10/1994 | Shinar et al. | 257/40 |
| 5,459,478 | 10/1995 | Bolger et al. | 345/82 |
| 5,504,323 | 4/1996 | Hegger et al. | 250/214 |
| 5,532,550 | 7/1996 | Adler | 345/82 |
| 5,674,597 | 10/1997 | Fujii et al. | 428/212 |

FOREIGN PATENT DOCUMENTS

| | | | |
|---|---|---|---|
| 0111566A1 | 6/1984 | European Pat. Off. | G09F 9/33 |
| 0457440A2 | 11/1991 | European Pat. Off. | G09G 3/30 |
| WO9516275 | 6/1995 | WIPO | H01J 40/14 |

OTHER PUBLICATIONS

D. Braun and A.J. Heeger in Applied Physics Letters 58 (18), pp. 1982–1984 (May 6, 1991).

Alt & Pleshko (IEEE Transactions on Electron Devices, vol. ED21, Feb. 2, 1974, pp. 146–155.

*Primary Examiner*—Xiao Wu
*Attorney, Agent, or Firm*—Steven R. Biren

[57] ABSTRACT

Control device for an electroluminescent display device, comprising an active layer of a semiconducting polymer of, for example pixels arranged in the form of a matrix, reducing flicker and crosstalk. The control device may be based on voltage control at which voltages across the pixels are at least 1.6 V, but is preferably based on current control, at which the duration of the data pulses determines the grey level.

23 Claims, 3 Drawing Sheets

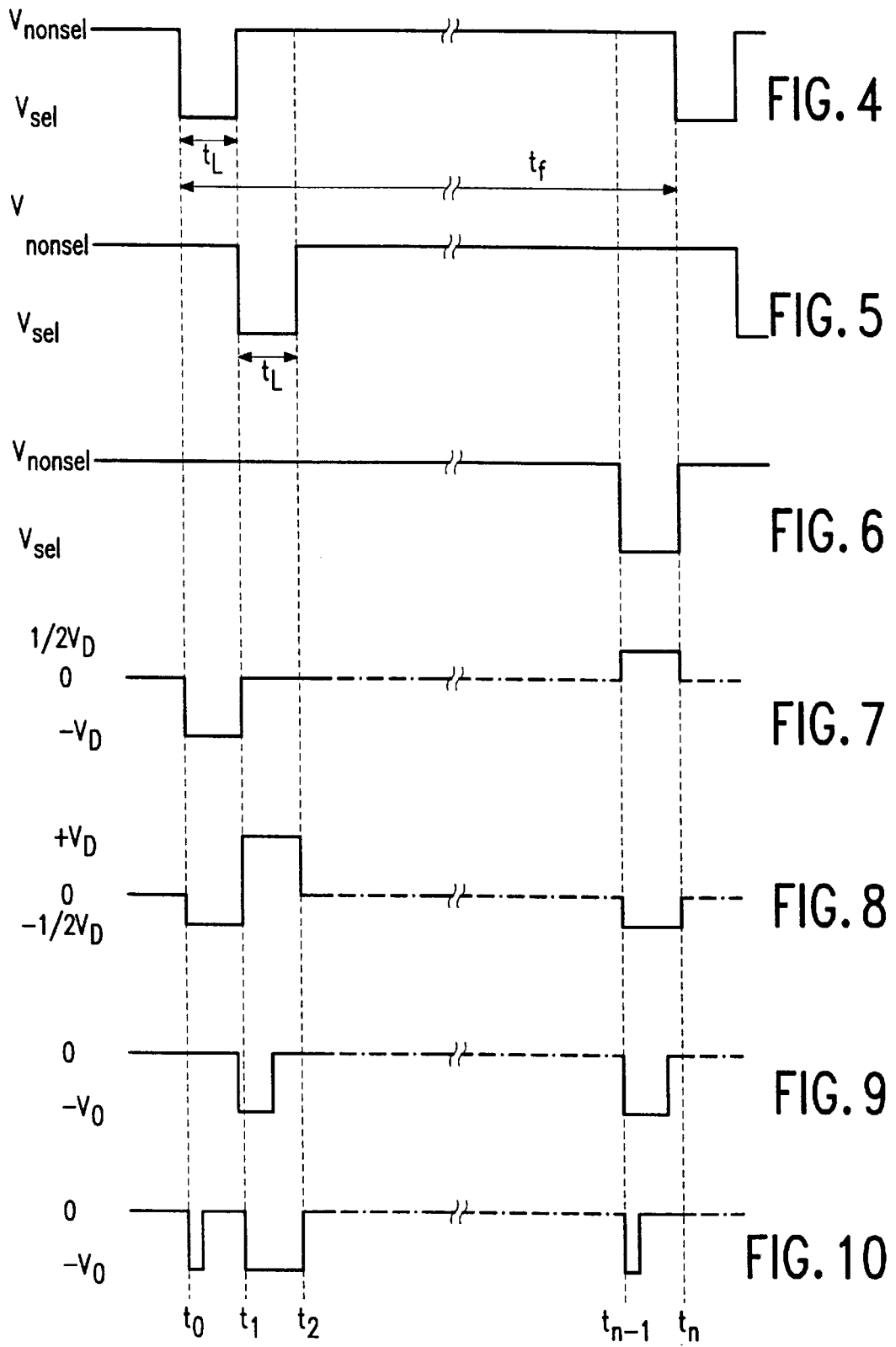

ELECTROLUMINESCENT DISPLAY DEVICE INCLUDING ACTIVE POLYMER LAYER

BACKGROUND OF THE INVENTION

The invention relates to an electroluminescent device comprising an active layer of a semiconducting conjugated polymer, which layer is present between a first and a second pattern of electrodes, at least one of the two patterns being transparent to the light to be emitted and a first pattern comprising a material which is suitable for injecting holes in the active layer.

The active layer and the two electrode layers may jointly constitute one light-emitting diode (LED), but the electroluminescent device preferably comprises a plurality of LEDs, for example in the form of a matrix of light-emitting surfaces as intended for a display.

Solid-state LEDs may be used as illumination sources and in, for example displays and indicator lamps. For the active layer in such structures, traditional III–V semiconductor compounds are generally used, such as doped GaAs and GaP. The operation is based on the recombinations of electron hole pairs which are injected in the semiconductor material from electrodes located on both sides of the active layer. Due to these recombinations, energy in the form of (visible) light is released, which is a phenomenon referred to as electroluminescence. The wavelength and hence the colour of the emitted light is determined by the bandgap of the semiconductor material.

The use of semiconducting organic polymers such as proposed in an article by D. Braun and A. J. Heeger in Applied Physics Letters 58 (18), pp. 1982–1984 (May 6, 1991) increases the number of possible materials for use in these types of devices. Semiconducting organic polymers have a conjugated polymer chain. The bandgap, the electron affinity and the ionization potential can be adjusted by suitable choice of the conjugated polymer chain and by the choice of suitable side chains. In contrast to electrically conducting polymers, these conjugated polymers are undoped. An active layer of such a polymer material may be manufactured by means of a CVD process, but is preferably manufactured by spin-coating of a solution of a soluble conjugated polymer. With these processes, LEDs and displays having a large light-emitting surface can be manufactured in a simple manner.

Matrix displays for displaying information, for example for video applications and monitors are divided into a large number of pixels which are arranged in rows and columns. Problems usually occur, notably when driving this type of matrix display. A first problem which may present itself is known as crosstalk at which a variation of the voltage at a row or column electrode has the effect of an unintentional voltage change across a (non-selected) pixel. Another problem which occurs particularly in larger matrixes such as used for, for example video information or datagraphic information, is the problem of flicker. Moreover, it is desirable, notably in video applications, that different values of light intensity (grey levels) can be emitted by the pixels.

OBJECTS AND SUMMARY OF THE INVENTION

It is an object of the present invention to obviate one or more of the above-mentioned drawbacks. To this end, an electroluminescent device according to the invention is characterized in that at areas of overlap of the electrode patterns, these electrode patterns, together with the intermediate polymer, form part of pixels, and the device comprises a drive circuit which, in operation, gives the first pattern a zero voltage or a negative voltage with respect to the second pattern at the location of non-selected pixels, and gives the first pattern a positive voltage of at least 1.6 V with respect to the second pattern at the location of selected pixels. At such a voltage, a small light output can still be observed.

The invention is based on the recognition that the rectifying character of the LED structure does not provide the possibility of driving such a display device in a matrix structure by means of drive methods which are generally used for passive display devices such as, for example the multiplex mode in accordance with Alt & Pleshko (IEEE Transactions on Electron Devices, Vol. ED21, Feb. 2, 1974, pp. 146–155). The diodes associated with the pixels should be switched off during non-selection by means of a zero voltage or a negative voltage of the first pattern with respect to the second pattern of electrodes. During selection, they should be switched on with a voltage which is sufficiently high to cause the LED to convey sufficient current, namely a positive voltage of at least 1.6 V of the first pattern with respect to the second pattern. There is no crosstalk or hardly any crosstalk at such voltages. The positive voltage of the first pattern with respect to the second pattern is preferably smaller than 20 V so that the drive electronics (ICs) can be realised in a simple and inexpensive IC technology.

The selection duration is usually also dependent on the application and the polymer material used. In a device according to the invention, in which the first and the second pattern comprise strip-shaped selection and data electrodes, the drive circuit preferably supplies the selection electrodes during selection with selection pulses having a pulse width of at least 5 microseconds. At such a pulse width, a high picture frequency can be realised without any problem, at which no flicker occurs (60 Hz or more) while at the same time a large number of rows (>1250) can be driven.

A preferred embodiment of an electroluminescent device according to the invention is characterized in that at areas of overlap of the electrode patterns, these electrode patterns, together with the intermediate polymer, form part of pixels, and the device comprises a drive circuit which, in operation, gives the first pattern a zero voltage or a negative voltage with respect to the second pattern at the location of non-selected pixels, and the drive circuit supplies a selected pixel with a substantially constant current during each selection of one or more pixels, the value of said constant current being determined by a grey level to be displayed.

It has been found that the separate pixels (LEDs) can be very well adjusted by means of current control. Light intensity variations (grey levels) can then be obtained in that during selection the drive circuit supplies data electrodes with data pulses whose pulse width is determined by a grey level to be displayed. This may already be realised at pulse widths of at least 50 nsec.

On the other hand, grey levels can be obtained in that the drive circuit supplies a selected pixel with a substantially constant current during each selection of one or more pixels, the value of said current being determined by a grey level to be displayed.

These and other aspects of the invention will be apparent from and elucidated with reference to the embodiments described hereinafter.

BRIEF DESCRIPTION OF THE DRAWINGS

In the drawings:

FIG. 3 is an equivalent circuit diagram of a display device according to the invention, while FIGS. 4 to 10 show control signals for such a device.

The Figures are diagrammatic and not to scale. Corresponding elements are generally denoted by the same reference numerals.

DESCRIPTION OF THE PREFERRED EMBODIMENTS

Figure 1:
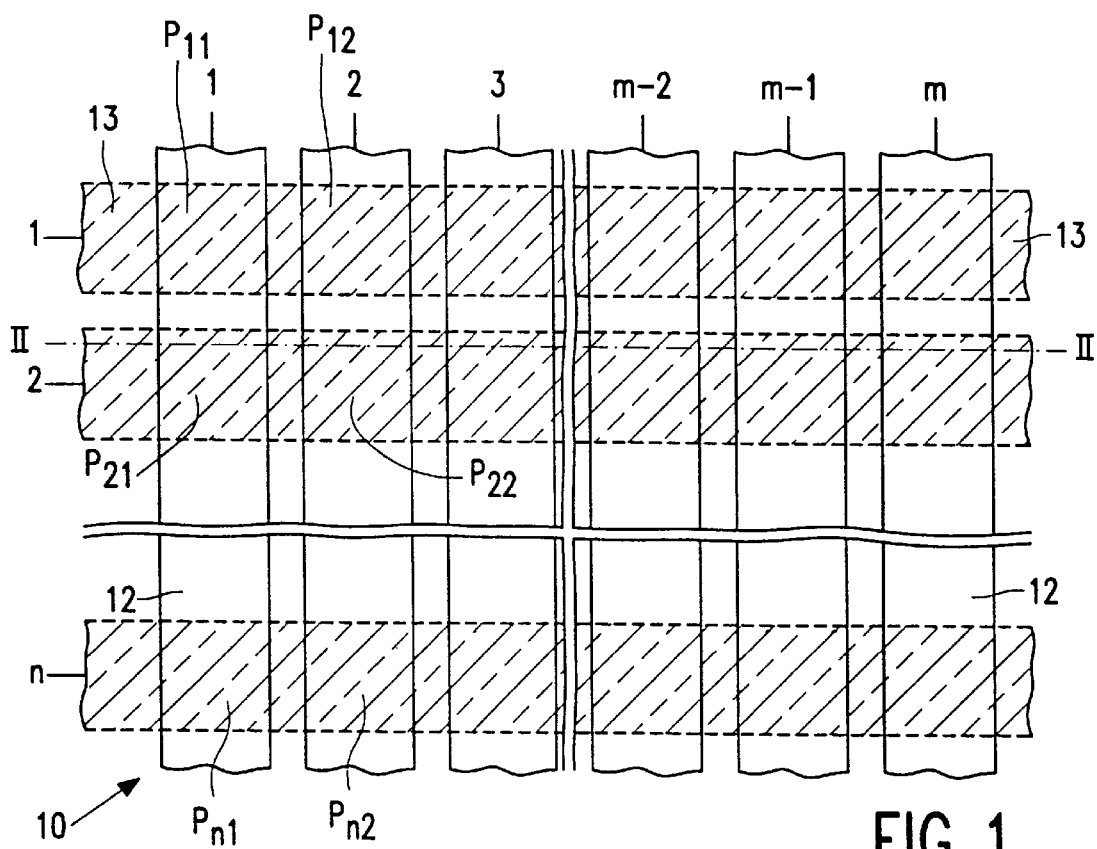
FIG. 1 is a diagrammatic plan view of a part of a display device according to the invention.
Figure 2:
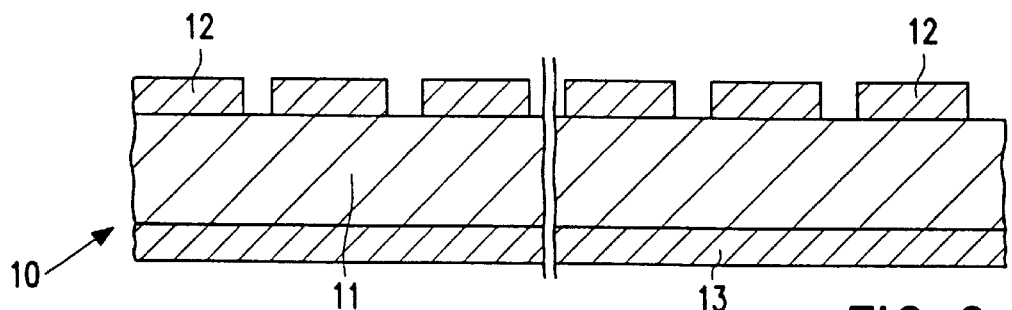
FIG. 2 is a diagrammatic cross-section taken on the line II—II in FIG. 1.

FIG. 1 is a plan view and FIG. 2 is a cross-section of a part of a display device 10 having an active layer 11 between two patterns 12, 13 of electrode layers of electrically conducting materials. In this embodiment, the electrodes 12 constitute column or data electrodes, while the electrodes 13 constitute row or selection electrodes. In this way, a matrix of light-emitting diodes (LEDs) 14 is formed with the intermediate active material, also referred to in this Application as picture elements 14 or pixels 14 (see FIG. 3). At least one of the electrode patterns is transparent to the emitted light in the active layer. During operation, the column or data electrodes 12 are driven in such a way that they have a sufficiently positive voltage with respect to the selection electrodes 13 for the injection of holes in the active layer. The material of these electrodes 12 has a high work function and is usually constituted by a layer of indium oxide or indium-tin oxide (ITO). Particularly ITO is suitable due to its good electric conductivity and high transparency. The selection electrodes 13 serve as negative electrodes (with respect to the electrodes 12) for the injection of electrons into the active layer. In this embodiment, the material of this layer is aluminium. A material having a low work function, for example indium, calcium, barium or magnesium is preferably chosen. Since larger currents usually flow through the row electrodes, they have a low-ohmic value which is obtained, for example by the material choice or the choice of the layer thickness.

The electrodes 12 of ITO are provided by means of vapour deposition, sputtering or a CVD process. These electrodes and generally also the electrodes 13 are structured in patterns by means of a conventional photolithographic process or by partial screening with a mask during the vapour deposition process in conformity with the desired pattern for the device 10.

Suitable conjugated polymers for use in the active or emissive layer 11 are polymers based on poly(3-alkylthiophene) and poly(p-phenylene vinylene) (PPV). Soluble conjugated polymers are preferably used because they can easily be processed in, for example a spin coating process.

Examples of soluble conjugated PPV derivates are poly (dialkoxy-p-phenylene vinylene) and poly(dialkyl-p-phenylene vinylene). The phenylene groups of these polymers are often 2.5 substituted with alkoxy or alkyl groups. Representatives of the first group are, for example, poly[2-methoxy,5-(2-ethylhexyloxy)-p-phenylene vinylene] (MEH-PPV) which emits yellow-orange light when used in the active layer, and poly[2-methoxy,5(3,7-dimethyloctyloxy)-p-phenylene vinylene] which emits orange light. Representatives of the second group are, for example: poly[2-methyl-5-(n-dodecyl)-p-phenylene vinylene], poly[2-methyl-5-(3,7-dimethyloctyl)-p-phenylenevinylene], and poly[2-methyl-5-(4,6,6-trimethylheptyl)-p-phenylene vinylene]. The latter three polymers emit green light when used in the active layer.

Dependent on the method of preparing the conjugated polymer, the polymer may comprise up to 15% of unconjugated units. Such unconjugated units appear to enhance the electroluminescence efficiency defined by the number of photons per injected electron in the active layer.

The above-mentioned conjugated PPV derivates are soluble in the usual organic solvents such as halogenated hydrocarbons, such as chloroform, and aromatic hydrocarbons such as toluene. Acetone and tetrahydrofurane may also be used as solvents.

The degree of polymerization of the conjugated polymer is between 10 and 100,000.

The active layer of the conjugated polymer generally has a layer thickness of between 10 and 250 nm, particularly between 100 and 200 nm.

The LED structure may be provided on a substrate consisting of, for example glass, quartz glass, ceramic material or synthetic material. A light-transmissive or transparent substrate is preferably used. If a flexible electroluminescent device is desired, a transparent foil of synthetic material is used. Suitable transparent and flexible synthetic materials are, for example polyimide, polyethylene terephtalate, polycarbonate, polyethene and polyvinyl chloride.

Figure 3:
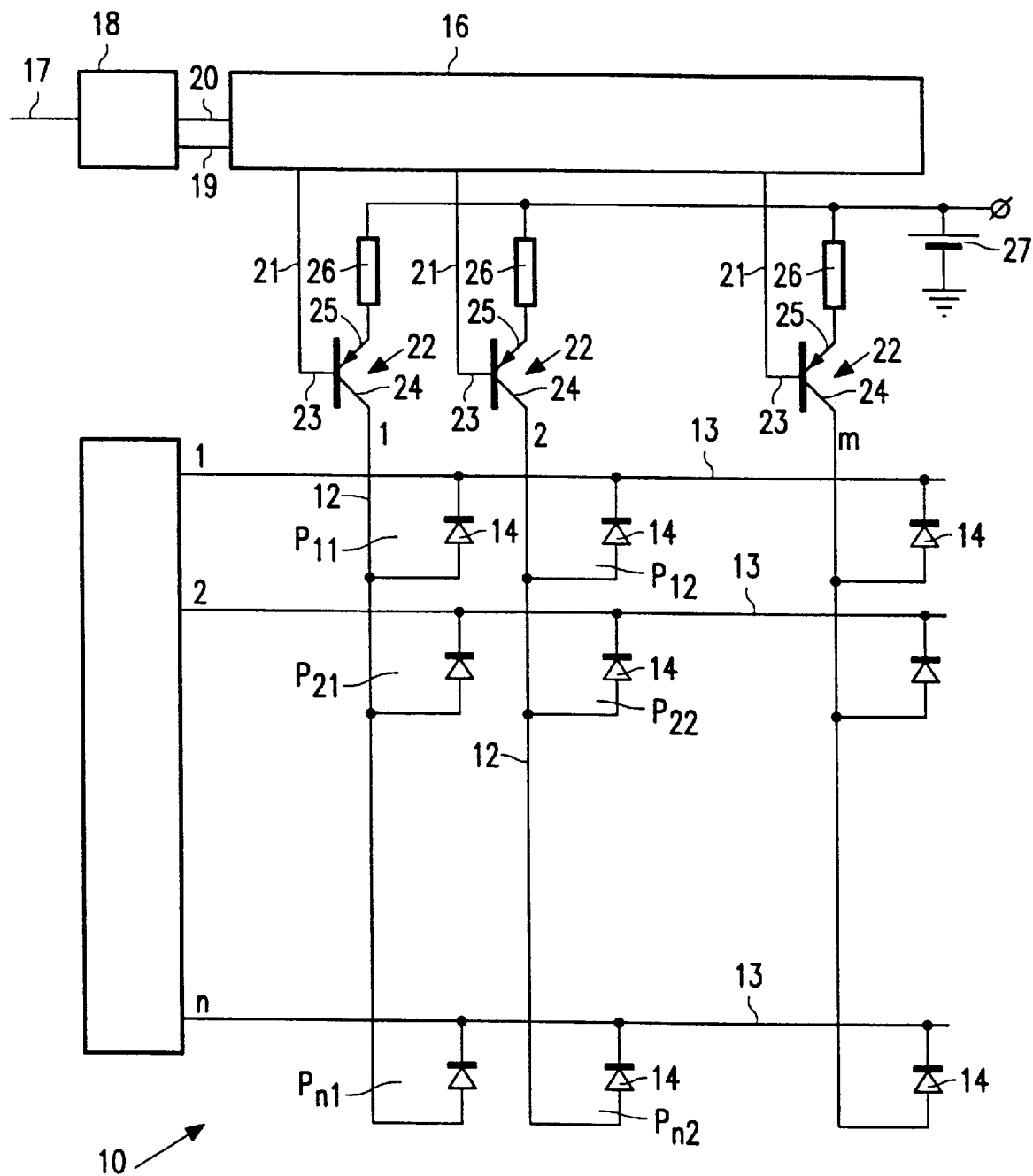

FIG. 3 is an equivalent circuit diagram of a part of a matrix of such LEDs 14 with n rows and m columns. This device further comprises a row selection circuit 15 (for example, a multiplex circuit) and a data register 16. Externally presented information 17, for example a video signal, is processed in a processing unit 18 which, dependent on the information to be displayed, charges the separate parts of the data register 16 via supply leads 19 in such a way that the bases 23 of transistors 22 (pnp transistors in this embodiment) are provided, via the lines 21, with a voltage related to said information. In this embodiment, the actual column conductors 12 are connected in an electrically conducting manner to the collectors 24 of the transistors 22, while the emitters 25 of these transistors are connected to a fixed voltage via resistors 26, in this embodiment a voltage of +2 V via a voltage source 27 which is connected to ground. The choice of the resistors 26, which have a substantially identical resistance, and of the voltages presented by the register 16 to the bases 23 are chosen in this embodiment in such a way that a combination of a transistor 22 and a resistor 26 can be considered as a substantially ideal current source. However, the relevant current source can only convey current if this current can be depleted via the collector. To this end, the voltage at a row electrode 13 should be sufficiently low. The relevant row selection voltages are presented by the row selection circuit 15. Mutual synchronization between the selection of the rows and the presentation of voltages to the lines 21 is effected by means of the drive unit 18 via drive lines 20.

The associated drive signals for such a device are shown diagrammatically in FIGS. 4 to 10. FIGS. 4 to 6 show the row selection signals or line selection signals which, in the above-mentioned examples, select the lines 1, 2 and n during a period $t_L$ by presenting a selection voltage $V_{sel}$. During the remainder of said period which is equal to, for example a picture period or (as in this case) a frame period $t_f$, a non-selection voltage $V_{nonsel}$ is presented.

During the frame period, such voltages are presented to the column or data electrodes 12 that the pixels $P_{11}$ and $P_{12}$ emit light at intensities of 0 and approximately $¼.I_o$, while the pixels $P_{21}$, and $P_{22}$ emit light at intensities of approximately $½.I_o$ and the pixels $P_{n1}$ and $P_{n2}$ emit light at intensities of approximately ¾.$I_o$ and ¼.$I_o$, in which $I_o$ is the maximum luminance.

FIGS. 7 and 8 show the voltages applied to the column electrodes 12 if the device is controlled by means of voltages (the current sources 22 shown in FIG. 3 are then absent, but the data voltages are presented directly from the register 16 to the column electrodes 12). From the instant $t_0$, line 1 is selected for a period $t_L$ by means of a voltage $V_{sel}$, while voltages $-V_D$ and $-½.V_D$ are presented to the column electrodes of column 1 and column 2. The resultant voltages across the diode structures, viewed from anode to cathode, are then $(-V_D-V_{sel})$ and $(-½.VD-V_{sel})$, respectively. From the instant $t_1$, line 2 is selected during a period $t_L$ by means of the voltage $V_{sel}$, while voltages 0 and $+V_D$ are presented to the column electrodes of column 1 and column 2. The resultant voltages across the diode structures are then $-V_{sel}$ and $(V_D-V_{sel})$, respectively. Similarly, line n is selected from the instant $t_{n-1}$ during a period $t_L$, while voltages $½.V_D$ and $-½.V_D$ are presented to the column electrodes of column 1 and column 2. The resultant voltages across the diode structures are then $(+½.V_D-V_{sel})$ and $(-½.V_D-V_{sel})$, respectively.

In this case, $V_{sel}$ and $V_D$ are chosen to be such (for example, a negative value for $V_{sel}$) that at a voltage $(-V_D-V_{sel})$ across the LED structure there is substantially no conductance and light is just not emitted, whereas at a voltage $(V_D-V_{sel})$ light is emitted at an intensity $I_0$. If a linear relationship is assumed to exist between the voltage across the LED and the emitted intensity, the pixels emit light at the above-mentioned intensity. Actually, this relationship is non-linear so that corrections for the intensity voltage variation of the LEDs (and other properties such as the threshold voltage) must be taken into account.

The voltage $V_{nonsel}$ is chosen to be such that, independent of the voltages at the column electrodes, a negative voltage or a zero voltage is always present during non-selection across the LED structure, viewed from the anode to the cathode, for example by choosing a positive value which is larger than the maximum data voltage ($V_{nonsel} > V_{Dmax}$).

However, when the current sources 22, 26 are used, there is a substantially linear relationship between the current conveyed and the light intensity. This provides the possibility of controlling the emitted quantity of light of the LEDs via current modulation. The data register 16 then supplies the bases 23 of the transistors 22 with such voltages that the associated current values vary between values corresponding to emitted light of the LEDs between values 0 and $I_0$.

Preferably, however, the incoming information 17 is processed in such a way (for example, by means of digital techniques) that the grey levels associated with this information are stored as pulse widths. The associated voltage variation at the bases of the transistors associated with the columns 1, 2, n is shown in FIGS. 9 and 10. During the period $t_0$–$t_1$, the transistor associated with column 1 is not selected and the transistor associated with column 2 is selected during ¼.$t_L$ by means of a voltage $V_0$ at its base. This voltage is chosen to be such that, with the choice of the resistors 26, the transistors 22 always convey such a current that at this current the intensity of the emitted light has a value of $I_0$ (for example, 0 V at the base at a voltage of +2 V at the common point of the emitter-resistors 26, for example via a voltage source 27). The associated light intensity of the pixels $P_{11}$ and $P_{12}$ is 0 and ¼.$I_0$, respectively. Simultaneously, $V_{nonsel}$ is chosen to be such again that, independent of the voltages at the column electrodes 12, it holds for the non-selected elements that the voltage between the data and row electrodes is zero or negative (viewed from the anode to the cathode across the LED structure).

During the period $t_1$–$t_2$, the transistor associated with column 1 is selected during ½.$t_L$, and the transistor associated with column 2 is selected during $t_L$ by means of the voltage $V_0$ at its base. The associated light intensity of the pixels $P_{21}$ and $P_{22}$ is ½$I_0$ and $I_0$. during the period $t_{n-1}$–$t_n$, the transistor associated with column 1 is selected during ¾.$T_L$ and the transistor associated with column 2 is selected during ¼$t_L$ by means of a voltage $V_0$ at its base. The associated light intensity of the pixels $p_{n1}$ and $p_{n2}$ is ¾.$I_0$ and ¼.$I_0$.

Although the value $I_0$ of the light intensity is achieved at a pulse width $t_L$ of the data pulses in this example, this value can be achieved with pulses which are much shorter. The data pulses shown in FIGS. 9 and 10 may thus have much shorter pulse widths than the actual line period $t_L$.

As described in the preamble, the voltage across the LEDs (pixels) may vary within a wide range if the voltage control described with reference to FIGS. 4 to 8 is used, provided that the forward voltage across the LED structure is sufficiently high to cause it to conduct in such a way (>1.6 V) that light emission occurs; for practical reasons (drive voltages to be supplied by ICs) this voltage preferably remains below 20 V, although this is not strictly necessary for operating the device.

Also the pulse width of the selection pulses (and hence of the data pulses) may be varied over a large range in both examples. For computer monitor applications, it is sufficient to use a minimum pulse width of 5 microseconds.

When current control is used, data pulses of 50 nsec can be used. It has been found that the above-mentioned voltages are satisfactory at these pulse widths. At smaller pulse widths, the required voltages will become rapidly larger, which leads to the above-mentioned practical drawbacks but in principle is not impossible.

Figure 11:
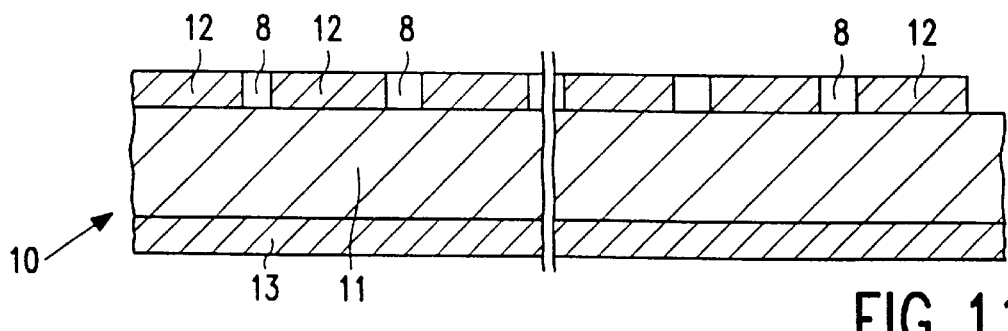
FIG. 11 shows a variant of the device shown in FIG. 2.

FIG. 11 shows a device according to the invention in which the transparent electrodes 12 are provided as areas of an electrically conducting polymer. A transparent electrode layer of a polymer is structured for this purpose, i.e. it has areas with different electrical properties. This means that, dependent on the location, the polymer of the electrode layer is present both in the conducting and in the non-conducting state. In addition to electrically conducting areas 12, which function as the actual electrodes for the injection of holes, the polymer layer comprises areas 8 which are electrically insulating. Electrically insulating is herein understood to mean a surface resistivity of at least $10^8$ Ω/square at the layer thicknesses used. At the layer thicknesses used, the electrically conducting areas have a surface resistivity of at most 1kΩ/square and are therefore suitable as electrodes.

Suitable polymers for use in the transparent electrode layers are polyaniline (PANI) and poly-3,4-ethylene dioxythiophene (PEDOT). These polymers can be given both the electrically conducting state and the insulating state.

In summary, the invention relates to a control device for an electroluminescent display device having an active layer of a semiconducting polymer, for example of pixels arranged in the form of a matrix, which reduces flicker and crosstalk. The control device may be based on voltage control at which voltages across the pixels may be between 1.6 and 20 V, but is preferably based on current control at which the duration of the selection pulses determines the grey level.

Although the invention has been described with reference to matrix displays, the drive methods and devices described may also be used in display devices having segmented picture electrodes (alphanumerical displays) or single LED structures.

Instead of the current sources shown, current sources based on pnp transistors or on MOS transistors may alternatively be used, while the use of current sources based on operational amplifiers is also possible.

What is claimed is:

1. An electroluminescent device comprising an active layer of a semiconducting polymer, said layer being present between a first and a second pattern of orthogonal electrodes, at least one of the two patterns being transparent to the light to be emitted and the first pattern comprising a material which is suitable for injecting holes in the active layer, characterized in that at areas of overlap of the electrode patterns, the electrode patterns, together with the intermediate polymer, form parts of pixels, and the device comprises a drive circuit which, in operation, gives the first pattern a zero voltage or a negative voltage with respect to the second pattern at the location of nonselected pixels, and gives the first pattern a positive voltage of at least 1.6 V with respect to the second pattern at the location of selected pixels, wherein the positive voltage is smaller than 20 V, and wherein the first and the second patterns comprise strip-shaped selection and data electrodes, and, during selection, the drive circuit supplies the selection electrodes with selection pulses having a pulse width of at least 5 microseconds.

2. An electroluminescent device as claimed in claim 1, characterized in that the drive circuit supplies a pixel during selection with a current having a substantially fixed value, while a grey level is determined by the width of a selection pulse.

3. An electroluminescent device as claimed in claim 1, characterized in that the first pattern forms part of an electrode layer in which areas of an electrically insulating polymer are arranged in patterns.

4. An electroluminescent device as claimed in claim 3, characterized in that the electrode layer comprises polyaniline or poly-3,4-ethylene dioxythiophene.

5. An electroluminescent device comprising an active layer of a semiconducting polymer, said layer being present between a first and a second pattern of orthogonal electrodes, at least one of the two patterns being transparent to the light to be emitted and the first pattern comprising a material which is suitable for injecting holes in the active layer, characterized in that at areas of overlap of the electrode patterns, the electrode patterns, together with the intermediate polymer, form parts of pixels, and the device comprises a drive circuit which, in operation, gives the first pattern a zero voltage or a negative voltage with respect to the second pattern at the location of non-selected pixels, and the drive circuit supplies a selected pixel with a substantially constant current during each selection of one or more pixels, the value of said constant current being determined by a grey level to be displayed.

6. An electroluminescent device as claimed in claim 5, characterized in that, during selection, the drive circuit supplies selected pixels with pulses having a pulse width of at least 50 nsec.

7. An electroluminescent device as claimed in claim 5, characterized in that the first and the second pattern comprise strip-shaped selection and data electrodes, and in that, during selection, the drive circuit supplies the selection electrodes with selection pulses having a pulse width of at least 5 microseconds.

8. An electroluminescent device comprising an active layer of a semiconducting polymer, said layer being provided between a first and a second pattern of electrodes, each pattern comprising a plurality of electrodes, at least one of the patterns being transparent to light to be emitted and the first pattern comprising a material which is suitable for injecting holes in the active layer, characterized in that at areas of overlap of the electrode patterns, the electrode patterns, together with the intermediate polymer, form parts of pixels, the device comprises a drive circuit which, in operation, gives the first pattern a zero voltage or a negative voltage with respect to the second pattern at the location of nonselected pixels, and the drive circuit comprises means for supplying a selected pixel with a substantially constant current during each selection of at least one pixel, the duration of the current supply being determined by a grey level to be displayed.

9. An electroluminescent device as claimed in claim 8, characterized in that picture elements dependent on supply or nonsupply with said substantially constant current emit light having a light intensity $I_0$ or zero light intensity.

10. An electroluminescent device as claimed in claim 8, characterized in that during current supply the part of the second pattern related to selected pixels is connected to a substantially constant current source.

11. An electroluminescent device as claimed in claim 8, characterized in that said drive circuit, in operation, gives the first pattern a zero voltage or a negative voltage with respect to the second pattern at the location of nonselected pixels, and gives the first pattern a positive voltage of at least 1.6 V with respect to the second pattern at the location of selected pixels.

12. An electroluminescent device as claimed in claim 11, characterized in that the positive voltage is smaller than 20 V.

13. An electroluminescent device as claimed in claim 8, characterized in that the first and the second pattern comprise strip-shaped selection and data electrodes, and in that, during selection, the drive circuit supplies the selection electrodes with selection pulses having a pulse width of at least 5 microseconds.

14. An electroluminescent device as claimed in claim 8, characterized in that picture elements emit light having a light intensity dependent on the supplied substantially constant current.

15. An electroluminescent device as claimed in claim 8, characterized in that the drive circuit controls a current source comprising a transistor and a resistor.

16. An electroluminescent device as claimed in claim 15, characterized in that a control line of the drive circuit supplies information to a base of the transistor.

17. An electroluminescent device comprising an active layer of a semiconducting polymer, said layer being present between a first and a second pattern of electrodes, each pattern comprising a plurality of electrodes, at least one of the patterns being transparent to the light to be emitted and a first pattern comprising a material which is suitable for injecting holes in the active layer, characterized in that at areas of overlap of the electrode patterns, the electrode patterns, together with the intermediate polymer, form parts of pixels, the device comprises a drive circuit which, in operation, gives the first pattern a zero voltage or a negative voltage with respect to the second pattern at the location of nonselected pixels, and the drive circuit supplies a selected pixel with a substantially constant current during each selection of at least one pixel, the value of said constant current being determined by a grey level to be displayed.

18. An electroluminescent device as claimed in claim 17, characterized in that during current supply the part of the second pattern related to selected pixels is connected to a substantially constant current source.

19. An electroluminescent device as claimed in claim 17, characterized in that said drive circuit, in operation, gives the first pattern a zero voltage or a negative voltage with respect to the second pattern at the location of nonselected pixels, and gives the first pattern a positive voltage of at least 1.6 V with respect to the second pattern at the location of selected pixels.

20. An electroluminescent device as claimed in claim 19, characterized in that the positive voltage is smaller than 20 V.

21. An electroluminescent device as claimed in claim 17, characterized in that the first and the second pattern comprise strip-shaped selection and data electrodes, and in that, during selection, the drive circuit supplies the selection electrodes with selection pulses having a pulse width of at least 5 microseconds.

22. An electroluminescent device as claimed in claim 17, characterized in that the drive circuit controls a current source comprising a transistor and a resistor.

23. An electroluminescent device as claimed in claim 22, characterized in that a control line of the drive circuit supplies information to a base of the transistor.

* * * * *